(12) United States Patent
Olivier et al.

(10) Patent No.: US 12,681,071 B2
(45) Date of Patent: Jul. 14, 2026

(54) SYSTEM AND METHOD FOR MEASURING RDSon, RDSoff AND CURRENT COLLAPSE ON SEMICONDUCTOR DEVICES

(71) Applicant: Microtesters, LLC, Cheyenne, WY (US)

(72) Inventors: Andre Claude Olivier, Cheyenne, WY (US); Nicholas Emil Olivier, Minot, ND (US); William Dopson, Chandler, AZ (US)

(73) Assignee: MICROTESTERS, LLC, Cheyenne, WY (US)

( * ) Notice: Subject to any disclaimer, the term of this patent is extended or adjusted under 35 U.S.C. 154(b) by 221 days.

(21) Appl. No.: 18/766,005

(22) Filed: Jul. 8, 2024

(65) Prior Publication Data
US 2025/0102557 A1 Mar. 27, 2025

Related U.S. Application Data

(60) Provisional application No. 63/584,583, filed on Sep. 22, 2023.

(51) Int. Cl.
*G01R 31/26* (2020.01)

(52) U.S. Cl.
CPC .................................. *G01R 31/2621* (2013.01)

(58) Field of Classification Search
CPC ............ G01R 19/0092; G01R 31/2621; G01R 19/175; G01R 31/28; G01R 1/203; G01R 19/0084; G01R 31/00; G01R 31/2836; G01R 19/00; G01R 19/16519; G01R 27/08; G01R 31/2633; G01R 31/2639; G01R 19/0023; G01R 19/003; G01R 31/26; G01R 21/06; G01R 31/3275; G01R 31/54
See application file for complete search history.

(56) References Cited

U.S. PATENT DOCUMENTS 7,606,015 B2 * 10/2009 Tanabe ............... H03K 17/0822
361/91.1
7,843,207 B2 * 11/2010 Rahman ............. G01R 31/2621
324/750.07
9,304,152 B2 * 4/2016 Aerts ...................... G05F 1/573

* cited by examiner

*Primary Examiner* — Vinh P Nguyen
(74) *Attorney, Agent, or Firm* — Schmeiser, Olsen & Watts LLP

(57) ABSTRACT
A new system and method for measuring RDSon, RDSoff and current collapse on semiconductor devices is provided. The system and method operate by measuring the current flow through the transistor, instead of measuring the voltage across the device under test. The viewing resistor gives us an accurate picture of the RDSon, RDSoff and current collapse recovery curve because it is on the same current path as the device under test.

18 Claims, 8 Drawing Sheets

RDSon Measurement 1

RDSoff Measurement
High Voltage Exposure

TIME

Dynamic RDSon Recovery

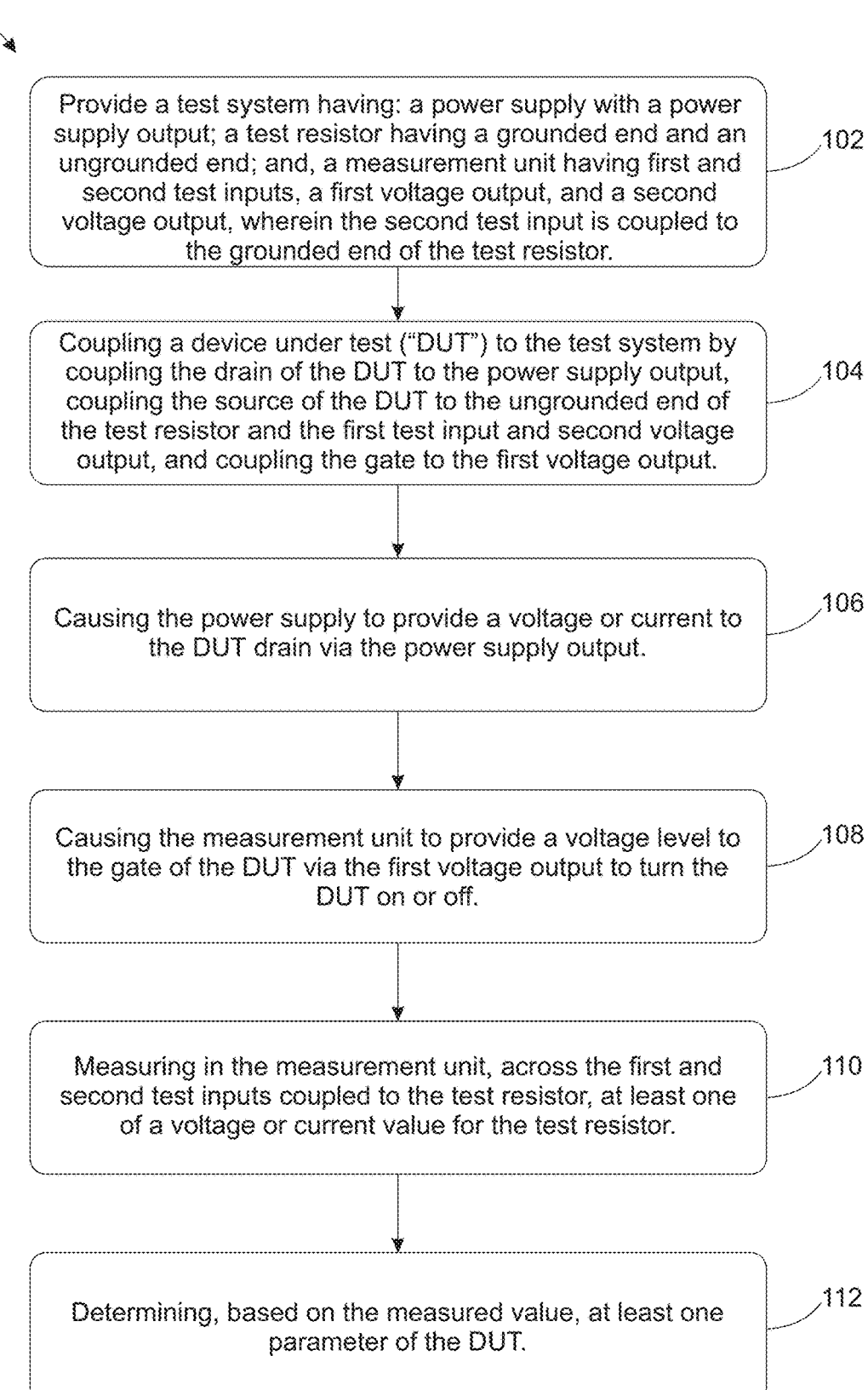

100

Provide a test system having: a power supply with a power supply output; a test resistor having a grounded end and an ungrounded end; and, a measurement unit having first and second test inputs, a first voltage output, and a second voltage output, wherein the second test input is coupled to the grounded end of the test resistor.                          102

Coupling a device under test ("DUT") to the test system by coupling the drain of the DUT to the power supply output, coupling the source of the DUT to the ungrounded end of the test resistor and the first test input and second voltage output, and coupling the gate to the first voltage output.                          104

Causing the power supply to provide a voltage or current to the DUT drain via the power supply output.                          106

Causing the measurement unit to provide a voltage level to the gate of the DUT via the first voltage output to turn the DUT on or off.                          108

Measuring in the measurement unit, across the first and second test inputs coupled to the test resistor, at least one of a voltage or current value for the test resistor.                          110

Determining, based on the measured value, at least one parameter of the DUT.                          112

FIG. 8

SYSTEM AND METHOD FOR MEASURING RDSon, RDSoff AND CURRENT COLLAPSE ON SEMICONDUCTOR DEVICES

CROSS REFERENCE TO RELATED APPLICATION(S)

This application claims priority to U.S. Provisional Patent Application entitled "A SYSTEM AND METHOD FOR MEASURING RDSon, RDSoff AND CURRENT COLLAPSE ON SEMICONDUCTOR DEVICES," Ser. No. 63/584,583, filed Sep. 22, 2023, the disclosure of which is hereby incorporated entirely herein by reference.

BACKGROUND OF THE INVENTION

Testing RDSon and Current Collapse on semiconductor transistors has been a challenging problem for the semiconductor test industry for some time. Techniques being used at present describe methods and systems requiring that a measurement instrument be connected across the drain and source pins of the transistor in question. The problem with this technique is that in order to protect the measurement instrument from damage, the user is forced to use clamping circuitry to protect the measurement instrument from high voltage. The result is that this added circuitry produces parasitic effects that cause inaccuracy in the measurements being taken. Furthermore, that technique also requires an extensive amount of time to measure the recovery from current collapse, increasing test time. In addition, the large clamping circuity required to protect the measurement instrument is problematic in that it takes up valuable physical space on the test fixture. These issues make the present technique a compromise.

Although previous systems and methods are well understood and have been used for some time, the need for protection circuitry to protect the measurement equipment reduces the accuracy of measurements made and consumes a large amount of text fixture space. These systems and methods also suffer from additional drawbacks, such as not measuring the actual drain-source current (Ids), adding parasitic loads to the tested devices drain pin, and inability to measure RDSoff (leakage). Finally, most traditional measurement systems and methods lack adequate voltage resolution.

Accordingly, what is needed is an improved system and method for testing semiconductor transistors that overcomes the shortcomings of existing techniques.

BRIEF DESCRIPTION OF THE DRAWINGS

A more complete understanding of the present invention may be derived by referring to the detailed description and claims when considered in connection with the Figures, wherein like reference numbers refer to similar items throughout the Figures, and:

DETAILED DESCRIPTION OF EMBODIMENTS OF THE INVENTION

Figure 1:
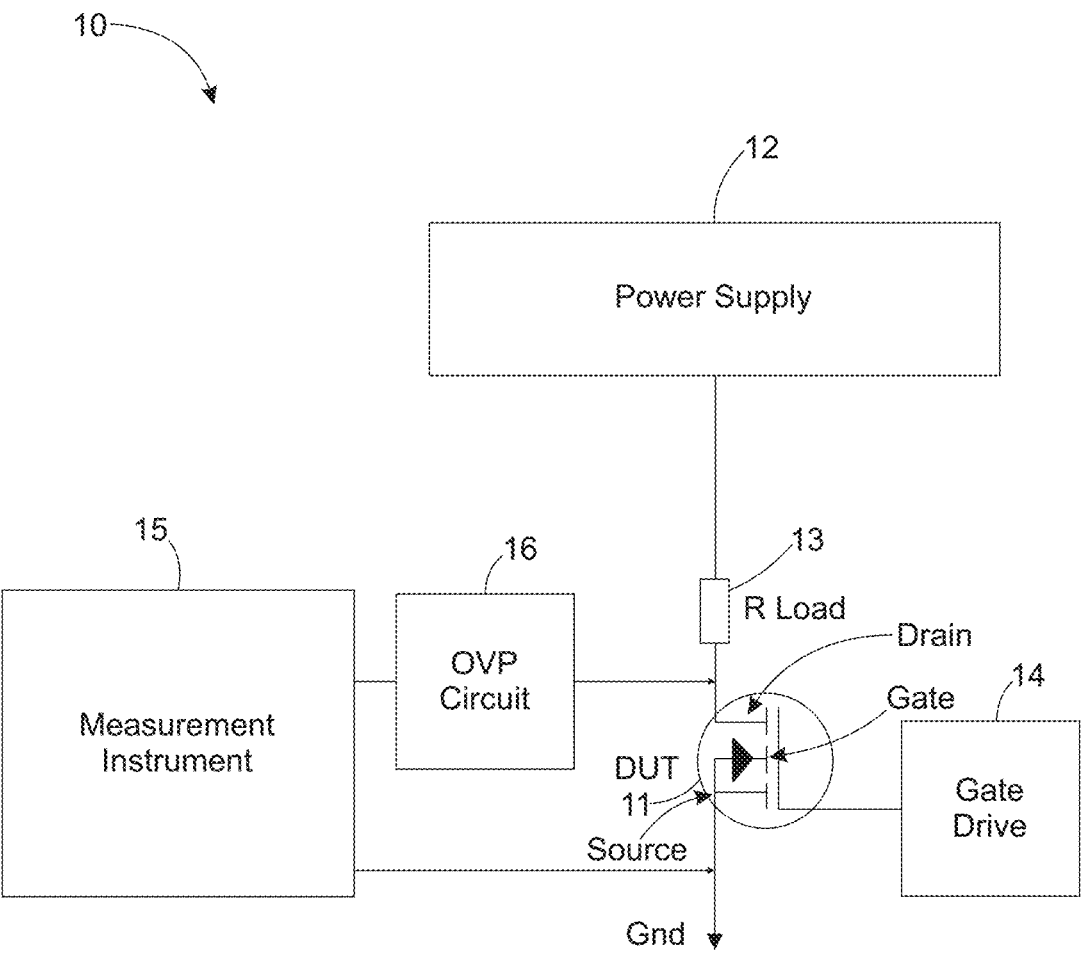
FIG. 1 is a schematic illustrating a prior art system and method for testing semiconductor transistors.

FIG. 1 is a schematic generally illustrating a prior art system and method for testing semiconductor transistors. As noted above, these older systems and methods suffer from many disadvantages.

Figure 2:
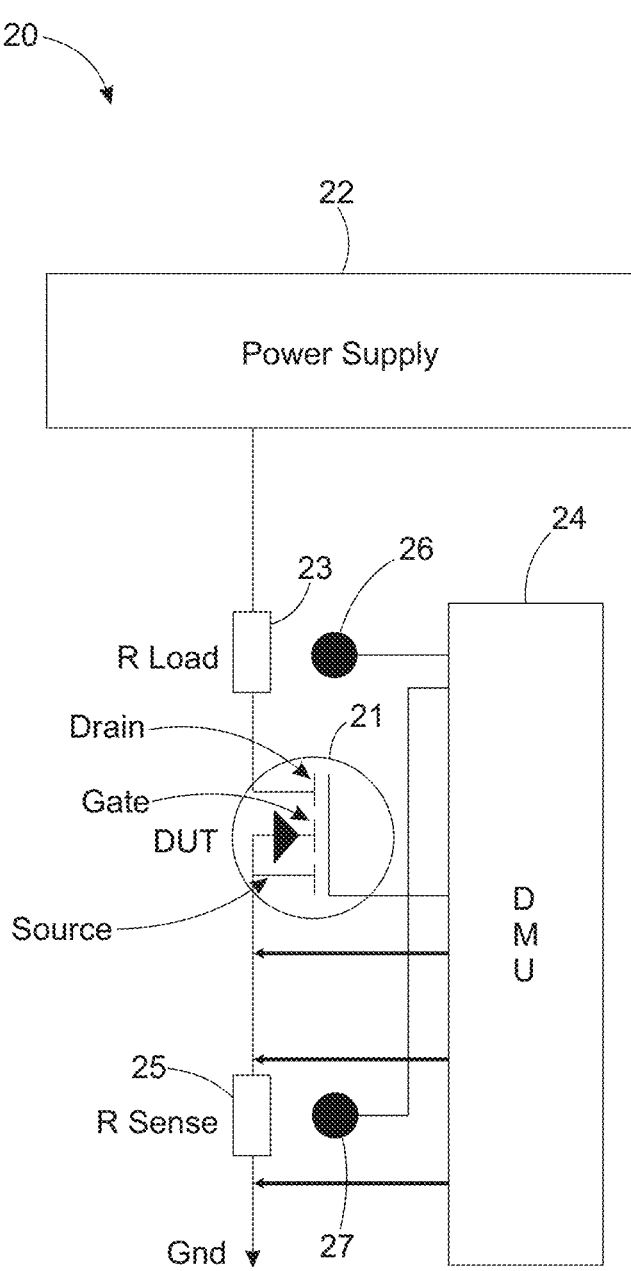
FIG. 2 is a schematic generally illustrating a system for testing a semiconductor transistor, according to an embodiment of the invention.

FIG. 2 is a schematic generally illustrating a test system 20 for testing a semiconductor transistor, according to an embodiment of the invention. FIG. 2 shows a "device under test" 21 (also referred to as a "DUT") that is to have various parameters tested by the test system 20. In the embodiment of FIG. 2, DUT 21 is a gallium nitride GaN/MOSFET transistor. In alternative embodiments, DUT 21 may be another type of transistor or other electronic component. In an alternative embodiment, the transistor under test (with gate, source, drain) may be part of a larger integrated circuit. It should be appreciated that some integrated circuits include GaN transistors in larger designs that can also include the gate Driver and other circuitry. It should also be appreciated that test system 20 is configured such that DUT 21 may be removed and replaced with other DUT 21s that are to be tested, with the remaining connections of test system 20 remaining as shown. In other words, DUT 21 is removable and replaceable.

In the embodiment of FIG. 2, the test system 20 includes a power supply 22 for providing power to DUT 21, and a load resistor 23 through which power is supplied to DUT 21 by power supply 22. In the embodiment of FIG. 2, load resistor 23 is used to limit the current through the transistor when it is on (conducting). As shown, power supply 22 supplies power to the drain of DUT 21 through load resistor 23. FIG. 2 also generally illustrates test system 20 including a sense resistor 25. As shown, the source of DUT 21 is coupled to ground through the sense resistor 25. As shown, test system 20 also includes a dynamic measurement unit ("DMU") 24. DMU 24 is configured to provide current and voltage to DUT 21, take fast, high-accuracy measurements of current and voltage associated with DUT 21 (for example, a microvoltmeter or a digitizer capable of quickly and accurately measuring low level voltages), monitor the temperature provided by temperature sensors of test system 20, and store and process these data. In an embodiment, DMU 24 is an instrument developed by Microtesters, LLC, and comprises digital logic, memory, a current source, a microvoltmeter, and complies with the NIST (National Institute of Standards and Technology) traceable transfer standard. In an embodiment, the DMU 24 is capable of measuring microvolts and micro-ohms and operates under hardware or software triggers from the test system. In that embodiment, once triggered, the DMU 24 takes a series of voltage or resistance measurements. The DMU 24 is configured to calculate statistics based on these measurements, such as, for example, average, standard deviation, histogram, non-linearity, and FFT of the data from the measurements. The DMU 24 is further configured to compare measurements and the calculated statistics to predetermined limits, and to use a pass/fail line (based on the comparisons) to inform the test system 20 of the result (i.e. whether or not the device passed or failed the test). In an embodiment, the test system 20 is configured to read measurements and statistics from the DMU 24 through a digital interface, such as SPI or USB or other communications bus or protocol. DMU 24 is shown electrically connected to sense resistor 25 by two electrical connections, one between each terminal of sense resistor 25 and DMU 24, for the measurement of parameters (voltage and/or current) associated with sense resistor 25. In an alternative embodiment, a dynamic voltage measuring instrument is connected across sense resistor 25. The dynamic voltage instrument takes fast measurements at regular intervals across sense resistor 25 to allow the tracking of DUT 21's recovery from a current collapse phenomenon.

Test system 20 further includes a temperature sensor 26 and a temperature sensor 27. Temperature sensor 26 is located near load resistor 23, and is electrically connected to DMU 24. Temperature sensor 27 is located near sense resistor 25 and is also electrically connected to DMU 24.

As shown, DMU 24 is electrically connected to the gate of DUT 21, and is configured to provide current and/or voltage to DUT 21. Test system 20 is further shown electrically connected to the source of DUT 21, and is configured to provide the reference voltage for gate drive level to DUT 21 via that connection. Test system 20 is further shown electrically connected to the source of DUT 21, and is configured to provide ground to DUT 21 via that connection. Power supply 22 is further shown electrically connected to the drain of DUT 21 through coupling load resistor 23, and is configured to provide current and/or voltage to DUT 21 via that connection.

While the detailed operation of various embodiments of the invention is described further below, the general operation of an embodiment of the invention is described herein, referring to FIG. 2. While test system 20 is testing DUT 21, power supply 22 provides power (current and/or voltage) to the drain of DUT 21. In the embodiment of FIG. 2, power supply 22 provides power to the drain of DUT 21 via load resistor 23. During testing, DUT 21 is turned off or on by DMU 24 by DMU providing a voltage or current (or no voltage or current—depending on what is being tested by test system 20) to DUT 21. During testing, DMU 24 tracks the temperature of load resistor 23 and sense resistor 25 via temperature sensor 26 and temperature sensor 27, respectively. DMU 24 stores temperature data as necessary for later retrieval and use by DMU 24 and test system 20. During testing, DMU 24 also provides current and/or voltage (or no current and/or voltage, depending on what is being tested) to the gate of DUT 21 relative to the source. Finally, during testing, DMU 24 monitors the current through and/or voltage across sense resistor 25 via its connections to each terminal of sense resistor 25. DMU 24 and test system 20 are configured to store this current and/or voltage information for immediate and/or later use by test system 20 and users of test system 20.

It should be appreciated that by measuring current and/or voltage using sense resistor 25 rather than across the source to drain pins of DUT 21, a more accurate measurement can be made of those parameters than was possible with previous methods, and in a shorter amount of time compared with previous methods. More specifically, this is accomplished by measuring the current flow through the sense resistor, instead of measuring the voltage directly across DUT 21. One skilled in the art will appreciate that by using a series circuit (sense resistor 25 in series with DUT 21, as shown), current flow through all of the components in the circuit (including DUT 21) is the same value. In other words, the current through sense resistor 25 should equal the current through DUT 21 (less any resistance effects contributed by DUT 21). Using Ohm's Law, one skilled in the art would know that measuring the voltage drop across sense resistor 25 will allow calculation of the current flowing through sense resistor 25. Because test system 20 can determine that current, and given that any RDSon, RDSoff associated with DUT 21 will modify the current flow in the circuit, test system 20 can determine RDSon, RDSoff, and other parameters associated with DUT 21 under various conditions. More specifically, by way of example, the measurement and calculations may be determined as follows (using the following measurements and principles): 1. Before test, measure sense resistor and load resistor in ohms. Optionally also measure the temperature of each of the sense resistor and load resistor. 2. Before testing the DUT, optionally store temperature coefficients (change in ohms/change in temperature) for each resistor in the test system. 3. During the testing of the DUT, measure voltage across the sense resistor. 4. During the testing of the DUT, optionally again measure the temperature of the sense resistor, and adjust the measured ohm value for the sense resistor using the temperature coefficient. 5. During testing of the DUT, optionally again measure the temperature of the load resistor, and adjust the measured ohm value for the load resistor using the temperature coefficient. 6. Calculate the current through the sense resistor, which will be equal to the voltage across the sense resistor divided by the resistance of the sense resistor. 7. Note that in a series circuit, the current through the sense resistor will also equal the current through the load resistor, which will also equal the current through the DUT drain-source. 8. Note that in a series circuit, the total resistance from the output of the power supply to ground will be the resistance of the sense resistor plus the resistance of the load resistor plus the resistance drain-source of the DUT. 9. Note that the total resistance from supply output to ground will also equal the voltage from the power supply divided by the current through the sense resistor. 10. Therefore, the resistance drain-source (RDS) of the DUT will be equal to the total resistance from the supply output to ground, minus the resistance of the sense resistor, and minus the resistance of the load resistor. Thus, using the measurements, known device topology and the above principles, we have been able to determine RDSon when the DUT is on, and RDSoff when DUT is off.

Furthermore (and as discussed in greater detail further below), by measuring with DMU 24 the initial slope of the recovery of DUT 21 from current collapse, and fitting the data into a well characterized model, test system 20 can predict the recovery time rather than waiting to actually measure the entire recovery curve. This considerably reduces test times. More specifically, in an embodiment, test system 20 uses Microtester, LLC's Dynamic Measurement Unit as DMU 24. In this case, DMU 24's curve tracer capability and ability to make rapid measurements across sense resistor 25 while DUT 21 is recovering are employed to measure only the initial portion of the recovery period, and then, using previously obtained information about DUT 21's fabrication process, accurately predict when the device under test will have fully recovered. Using this information to project the recovery time, eliminates the need to continue to test DUT 21 until it has completely recovered, while still providing an accurate representation of what the recovery time would be.

In another embodiment, test system 20 characterize load resistor 23 and/or sense resistor 25 using temperature data from temperature sensor 26 and temperature sensor 27 to determine and record the thermal coefficients of the resistance values associated with load resistor 23 and/or sense resistor 25, storing those values in non-volatile memory or some other storage device for use during testing. During testing, an onboard microcontroller or processor on DMU 24 is configured to monitor the temperature of load resistor 23 and/or sense resistor 25 and adjust measurements and calculations to compensate for temperature changes.

It should be appreciated that by measuring parameters across sense resistor 25 rather than across the DMU 21 itself, it is possible to measure at least three key parameters (RDSon, RDSoff, Current Collapse) with one common circuit that does not change between measurements. Measuring parameters (including these three key parameters) with the same circuit eliminates any errors due to test circuit differences (a problem with earlier methods and systems that employ multiple (different) circuits to measure the three parameters for the same device being tested. It should also be appreciated that this system eliminates measurement errors due to parasitic or other effects. Finally, it eliminates the use of clamping circuits to protect the measurement instrument, an important benefit given that clamping circuits greatly reduce the accuracy of the measurements taken by measurement instruments.

Figure 3:
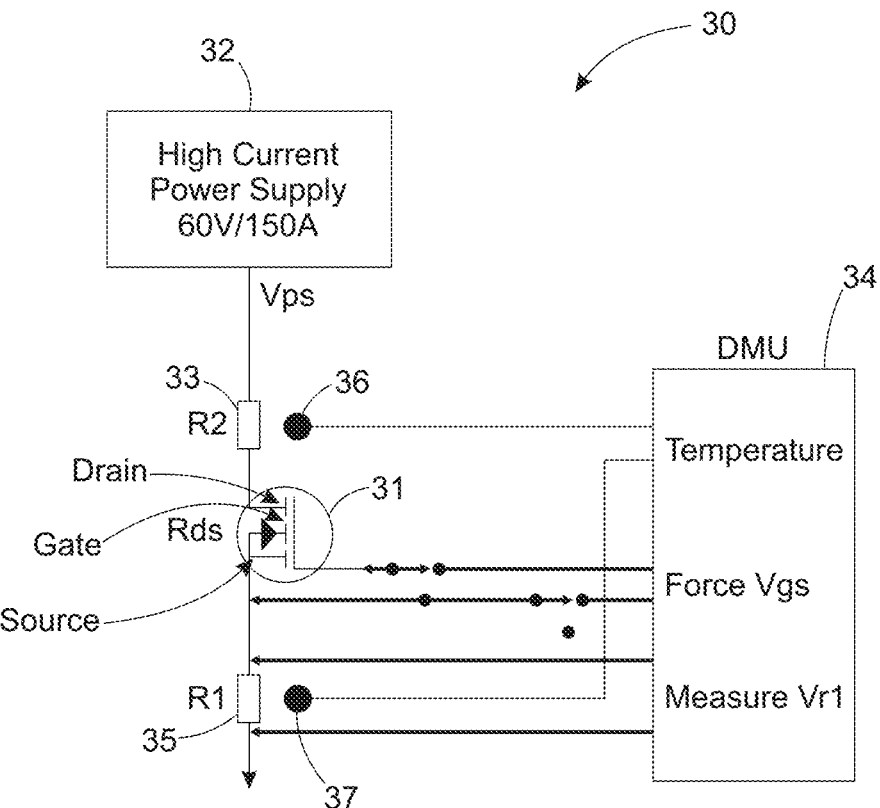
FIG. 3 is a schematic generally illustrating a system for testing a semiconductor transistor to measure RDSon at normal operating voltage while the transistor is turned on, according to an embodiment of the invention.

FIG. 3 is a schematic generally illustrating a test system 30 for testing a semiconductor transistor to measure RDSon at normal operating voltage while the transistor is turned on, according to an embodiment of the invention. FIG. 3 includes "device under test" 31 (also referred to as a "DUT") connected to tests system 30 that is to have various parameters tested by the test system 30. In the embodiment of FIG. 3, DUT 31 is a gallium nitride GaN/MOSFET transistor. Test system 30 is configured such that DUT 31 may be removed and replaced with other GaNs or MOSFET transistors or DUT 31s that are to be tested. In other words, DUT 31 is removable and replaceable within test system 30 so that test system 30 may test other GaNs or MOSFET, transistors, or other devices.

Test system 30 is also shown having a power supply 32 for providing power to DUT 31, and a load resistor 33 through which power is supplied to DUT 31 by power supply 32. In the embodiment of FIG. 3, power supply 32 is a high current power supply configured to provide at least 60V at 150 A. It should be appreciated that in other embodiments, power supply 32 may be configured to provide various voltages, currents, and power levels. In the embodiment of FIG. 3, load resistor 33 is used to limit the current through the transistor when it is on (conducting), and has a resistance value of 100 mΩ and is rated for 100 W. In alternative embodiments, load resistor 33 may have other resistance values, and may be rated for different wattages. As shown, power supply 32 supplies power to the drain of DUT 31 through load resistor 33. In the embodiment of FIG. 3, power supply 32 is adjusted to provide a voltage of 2.7V. In alternative embodiments, power supply 32 may be adjusted to provide other voltages. FIG. 3 also generally illustrates test system 30 including a sense resistor 35. As shown, the source of DUT 31 is coupled to ground through the sense resistor 35. In the embodiment of FIG. 3, sense resistor 35 has a resistance value of 10 mΩ and is rated at 10 W. As shown, test system 30 also includes a dynamic measurement unit ("DMU") 34. DMU 34 is configured to provide current and voltage to DUT 31, take fast, high-accuracy measurements of current and voltage associated with DUT 31 (for example, comprising a microvoltmeter or a digitizer capable of quickly and accurately measuring low level voltages), monitor the temperature provided by temperature sensors of test system 30, and store and process these data. DMU 34 is shown electrically connected to sense resistor 35 by two electrical connections, one between each terminal of sense resistor 35 and DMU 34, for the measurement of parameters (voltage and/or current) associated with sense resistor 35.

Test system 30 further includes a temperature sensor 36 and a temperature sensor 37. Temperature sensor 36 is located near load resistor 33, and is electrically connected to DMU 34. Temperature sensor 37 is located near sense resistor 35 and is also electrically connected to DMU 34.

As shown, DMU 34 is electrically connected to the gate of DUT 31, and is configured to provide current and/or voltage to DUT 31. Test system 30 is further shown electrically connected to the source of DUT 31, and is configured to provide the reference voltage for gate drive level to DUT 31 via that connection. Test system 30 is further shown electrically connected to the source of DUT 31, and is configured to provide ground to DUT 31 via that connection. Power supply 32 is further shown electrically connected to the drain of DUT 31 through coupling load resistor 33, and is configured to provide current and/or voltage to DUT 31 via that connection.

In the embodiment of FIG. 3, prior to beginning a test of DUT 31, the resistance values of load resistor 33 and sense resistor 35 are characterized to record thermal coefficients for the resistance values for each resistor as those resistance values vary with temperature. Those thermal coefficients are stored in memory of the DMU 34 for use during the test of DUT 31 to adjust calculations based on the temperature detected by temperature sensor 36 and temperature sensor 37 of the resistors to which they correspond. More specifically, during testing, DMU 34 monitors the temperature of load resistor 33 and sense resistor 35, and adjusts the stored values of load resistor 33 and sense resistor 35, used to calculate RDSon and RDSoff, to compensate for temperature changes.

Once the power supply 32 voltage has reached the desired level (in this case, 2.7V), DMU 34 provide a voltage to the gate of DUT 31 such that DUT 31 enters the "on" state. While DUT 31 is in the "on" state and power supply 32 is supplying the required voltage, DMU 34 measures the voltage across sense resistor 35, and determines RDSon for DUT 31, adjusting the measurements and determined value based on the detected temperature from temperature sensor 36, temperature sensor 37, and the previously characterized temperature coefficients for load resistor 33 and sense resistor 35. It should be appreciated that in alternative embodiments, RDSon for DUT 31 may be determined without factoring in temperature. It should also be appreciated that in alternative embodiments, the voltage/current provided by power supply 32 to DUT 31 and/or, the voltage/current provided at the gate of DUT 31 by DMU 34 may vary based on the test being run and the specific DUT 31 being tested.

Figure 4:
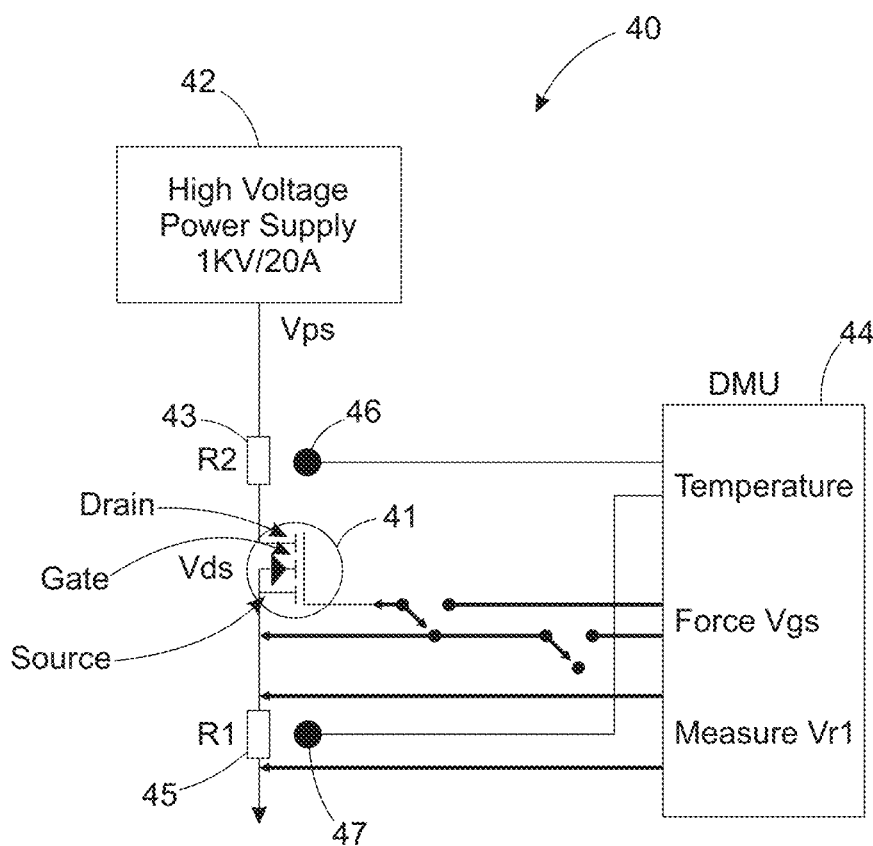
FIG. 4 is a schematic generally illustrating a system for testing a semiconductor transistor to measure RDSoff while subjecting the transistor to high voltage while the transistor is turned off, according to an embodiment of the invention.

FIG. 4 is a schematic generally illustrating a test system 40 for testing a semiconductor transistor to measure RDSoff during high voltage while the transistor is turned off, according to an embodiment of the invention. FIG. 4 includes "device under test" 41 (also referred to as a "DUT") connected to test system 40 that is to have various parameters tested by the test system 40. In the embodiment of FIG. 4, DUT 41 is a gallium nitride GaN/MOSFET transistor. Test system 40 is configured such that DUT 41 may be removed and replaced with other GaNs or MOSFET transistors or DUT 41s that are to be tested. In other words, DUT 41 is removable and replaceable within test system 40 so that test system 40 may test other GaNs or MOSFET transistors, other transistors, or other devices.

As shown, DMU 44 is electrically connected to the gate of DUT 41, and is configured to provide current and/or voltage to DUT 41. Test system 40 is further shown electrically connected to the source of DUT 41, and is configured to provide the reference voltage for gate drive level to DUT 41 via that connection. Test system 40 is further shown electrically connected to the source of DUT 41, and is configured to provide ground to DUT 41 via that connection. Power supply 42 is further shown electrically connected to the drain of DUT 41 through coupling load resistor 43, and is configured to provide current and/or voltage to DUT 41 via that connection.

In this embodiment, prior to testing, DMU 44 is configured to provide a voltage to the gate of DUT 41 such that DUT 41 enters the "off" state. In an alternative embodiment, turning DUT 41 into the off state may also be accomplished by connecting the DUT 41 gate to the DUT 41 source. Test system 40 is also shown having a high voltage power supply 42 for providing power to DUT 41, and a load resistor 43 through which power is supplied to DUT 41 by power supply 42. In the embodiment of FIG. 4, power supply 42 is a high voltage power supply configured to provide at least 1 KV at 20 A. It should be appreciated that in other embodiments, power supply 42 may be configured to provide various voltages, currents, and power levels. In the embodiment of FIG. 4, load resistor 43 is used to limit the current through the transistor when it is on (conducting), and has a resistance value of 100 mΩ and is rated at 100 W. In alternative embodiments, load resistor 43 may have other resistance values, and may be rated for different wattages. As shown, once DUT 41 is in the off state, power supply 42 supplies power to the drain of DUT 41 through load resistor 43. In the embodiment of FIG. 4, power supply 42 is adjusted to provide a voltage according to the specification of the DUT. In its off state, the transistor is specified to ideally allow no current flow. This spec is typically called Drain-to-Source Voltage (Continuous). If the DUT fails this test, we measure a voltage drop across the sense resistor and determine the leakage current using Ohm's Law. In alternative embodiments, power supply 42 may be adjusted to provide other voltages, including voltages that are in excess of the normal operating voltage of DUT 41. FIG. 4 also generally illustrates test system 40 including a sense resistor 45. As shown, the source of DUT 41 is coupled to ground through the sense resistor 45. In the embodiment of FIG. 4, sense resistor 45 has a resistance value of 10 mΩ and is rated at 10 W. As shown, test system 40 also includes a dynamic measurement unit ("DMU") 44. DMU 44 is configured to provide current and voltage to DUT 41, take fast, high-accuracy measurements of current and voltage associated with DUT 41 (for example, comprising a microvoltmeter or a digitizer capable of quickly and accurately measuring low level voltages), monitor the temperature provided by temperature sensors of test system 40, and store and process these data. DMU 44 is shown electrically connected to sense resistor 45 by two electrical connections, one between each terminal of sense resistor 45 and DMU 44, for the measurement of parameters (voltage and/or current) associated with sense resistor 45.

Test system 40 further includes a temperature sensor 46 and a temperature sensor 47. Temperature sensor 46 is located near load resistor 43, and is electrically connected to DMU 44. Temperature sensor 47 is located near sense resistor 45 and is also electrically connected to DMU 44.

In the embodiment of FIG. 4, prior to beginning a test of DUT 41, the resistance values of load resistor 43 and sense resistor 45 are characterized to record thermal coefficients for the resistance values for each resistor as those resistance values vary with temperature. Those thermal coefficients are stored in memory of the DMU 44 for use during the test of DUT 41 to adjust calculations based on the temperature detected by temperature sensor 46 and temperature sensor 47 of the resistors to which they correspond. More specifically, during testing, DMU 44 monitors the temperature of load resistor 43 and sense resistor 45, and adjusts the stored values of load resistor 43 and sense resistor 45, used to calculate RDSon and RDSoff, to compensate for temperature changes.

While DUT 41 is in the "off" state and power supply 42 is supplying the required voltage, DMU 44 measures the voltage across sense resistor 45, and determines RDSoff for DUT 41, adjusting the measurements and determined value based on the detected temperature from temperature sensor 46, temperature sensor 47, and the previously characterized temperature coefficients for load resistor 43 and sensor 45. It should be appreciated that in alternative embodiments, RDSon for DUT 41 may be determined without factoring in temperature. It should also be appreciated that in alternative embodiments, the voltage/current provided by power supply 42 to DUT 41 and/or, the voltage/current provided at the gate of DUT 41 by DMU 44 may vary based on the test being run and the specific DUT 41 being tested. In this embodiment, once RDSoff has been determined, the voltage supplied by power supply 42 is ramped back down to safe operating voltage of DUT 41, typically 0V.

Figure 5:
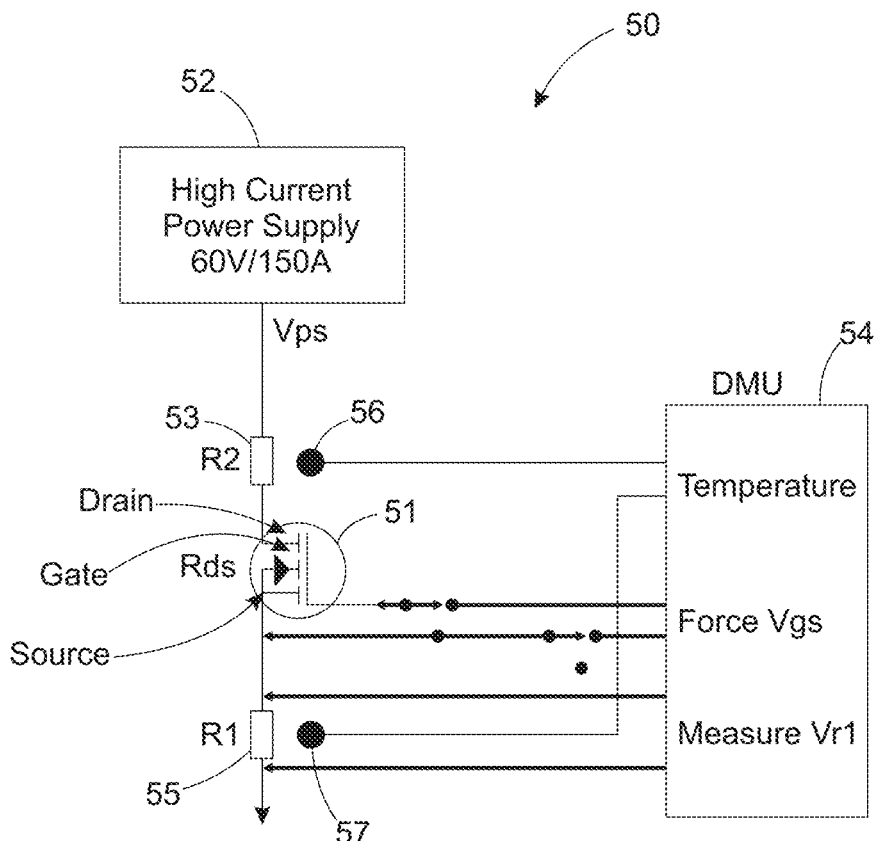
FIG. 5 is a schematic generally illustrating a system for testing a semiconductor transistor to measure recovery from current collapse RDSon at normal operating voltages while the transistor is turned on, according to an embodiment of the invention.

FIG. 5 is a schematic generally illustrating a test system 50 for testing a semiconductor transistor to measure RDSon at normal operating voltage while the transistor is turned on, and in conjunction with recovery from current collapse, according to an embodiment of the invention. FIG. 5 includes "device under test" 51 (also referred to as a "DUT") connected to tests system 50 that is to have various parameters tested by the test system 50. In the embodiment of FIG. 5, DUT 51 is a gallium nitride GaN/MOSFET transistor. Test system 50 is configured such that DUT 51 may be removed and replaced with other GaNs or MOSFET transistors or DUT 51s that are to be tested. In other words, DUT 51 is removable and replaceable within test system 50 so that test system 50 may test other GaNs or MOSFET transistors, other transistors, or other devices.

Test system 50 is also shown having a power supply 52 for providing power to DUT 51, and a load resistor 53 through which power is supplied to DUT 51 by power supply 52. In the embodiment of FIG. 5, power supply 52 is a high current power supply configured to provide at least 60V at 150 A. It should be appreciated that in other embodiments, power supply 52 may be configured to provide various voltages, currents, and power levels. In the embodiment of FIG. 5, load resistor 53 is used to limit the current through the transistor when it is on (conducting), and has a resistance value of 100 mΩ and is rated at 100 W. In alternative embodiments, load resistor 53 may have other resistance values, and may be rated for different wattages. As shown, power supply 52 supplies power to the drain of DUT 51 through load resistor 53. In the embodiment of FIG. 5, power supply 52 is adjusted to provide a voltage of 2.7V. In alternative embodiments, power supply 52 may be adjusted to provide other voltages. FIG. 5 also generally illustrates test system 50 including a sense resistor 55. As shown, the source of DUT 51 is coupled to ground through the sense resistor 55. In the embodiment of FIG. 5, sense resistor 55 has a resistance value of 10 mΩ and is rated at 10 W. As shown, test system 50 also includes a dynamic measurement unit ("DMU") 54. DMU 54 is configured to provide current and voltage to DUT 51, take fast, high-accuracy measurements of current and voltage associated with DUT 51 (for example, comprising a microvoltmeter or a digitizer capable of quickly and accurately measuring low level voltages), monitor the temperature provided by temperature sensors of test system 50, and store and process these data. DMU 54 is shown electrically connected to sense resistor 55 by two electrical connections, one between each terminal of sense resistor 55 and DMU 54, for the measurement of parameters (voltage and/or current) associated with sense resistor 55.

Test system 50 further includes a temperature sensor 56 and a temperature sensor 57. Temperature sensor 56 is located near load resistor 53, and is electrically connected to DMU 54. Temperature sensor 57 is located near sense resistor 55 and is also electrically connected to DMU 54.

As shown, DMU 54 is electrically connected to the gate of DUT 51, and is configured to provide current and/or voltage to DUT 51. Test system 50 is further shown electrically connected to the source of DUT 51, and is configured to provide the reference voltage for gate drive level to DUT 51 via that connection. Test system 50 is further shown electrically connected to the source of DUT 51, and is configured to provide ground to DUT 51 via that connection. Power supply 52 is further shown electrically connected to the drain of DUT 51 through coupling load resistor 53, and is configured to provide current and/or voltage to DUT 51 via that connection.

In the embodiment of FIG. 5, prior to beginning a test of DUT 51, the resistance values of load resistor 53 and sense resistor 55 are characterized to record thermal coefficients for the resistance values for each resistor as those resistance values vary with temperature. Those thermal coefficients are stored in memory of the DMU 54 for use during the test of DUT 51 to adjust calculations based on the temperature detected by temperature sensor 56 and temperature sensor 57 of the resistors to which they correspond. More specifically, during testing, DMU 54 monitors the temperature of load resistor 53 and sense resistor 55, and adjusts the stored values of load resistor 53 and sense resistor 55, used to calculate RDSon and RDSoff, to compensate for temperature changes.

Once the power supply 52 voltage has reached the desired level (in this case, 2.7V), DMU 54 provide a voltage to the gate of DUT 51 such that DUT 51 enters the "on" state. While DUT 51 is in the "on" state and power supply 52 is supplying the required voltage, DMU 54 measures sequentially (at successive discrete points in time) measures the voltage across sense resistor 55, and determines RDSon for DUT 51 at those multiple, discrete points in time, adjusting the measurements and determined value based on the detected temperature from temperature sensor 56, temperature sensor 57, and the previously characterized temperature coefficients for load resistor 53 and sense resistor 55. It should be appreciated that in alternative embodiments, RDSon for DUT 51 may be determined without factoring in temperature. It should also be appreciated that in alternative embodiments, the voltage/current provided by power supply 52 to DUT 51 and/or, the voltage/current provided at the gate of DUT 51 by DMU 54 may vary based on the test being run and the specific DUT 51 being tested.

By measuring RDSon at discrete points in time until DUT 51 has recovered, test system 50 is configured to determine the recovery time from current collapse for the DUT 51 based on the RDSon measurements over time. In addition, and in an alternative embodiment, because reducing testing time is important, test system 50 may be configured to only measure RDSon for the first portion of the recovery period (for example, 2, 3, 4 or more measurement points where the measurements are completed before the DUT 51 has completed recovery). Test system 50 is then configured, based on a previously determined model for DUT 51 device performance, to use this subset of RDSon points and fit them to the model to predict, based on the subset of points and the model, what the full recovery time would be. In this embodiment, it is possible to determine the recovery time for DUT 51 without actually testing the DUT 51 for the entire recovery time period, saving valuable testing time. This sampling approach is discussed additionally below with respect to FIG. 6.

Figure 6:
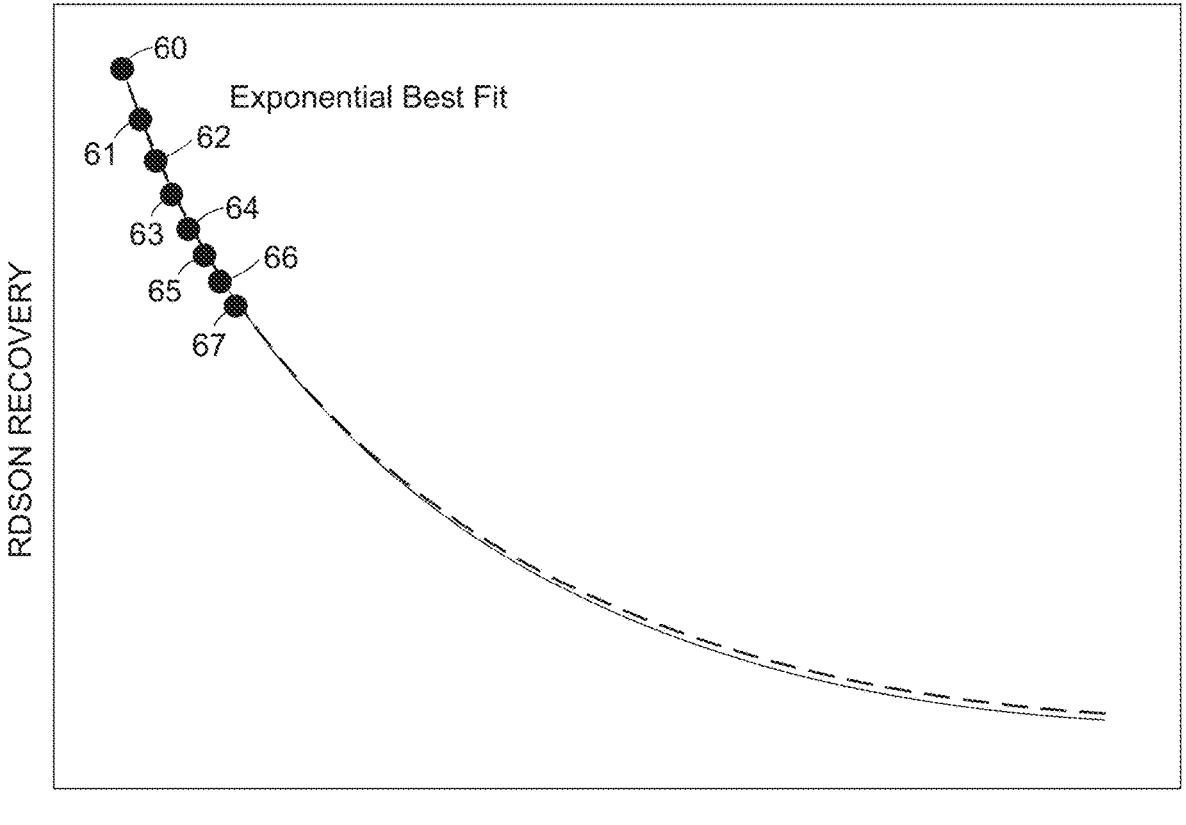
FIG. 6 is a graph generally illustrating parameters measured, and a resulting best fit projection of future parameters based on measured parameters and a device model, according to an embodiment of the invention.

FIG. 6 is a graph generally illustrating parameters measured, and a resulting best fit projection of future parameters based on measured parameters and a device model, according to an embodiment of the invention. As discussed with each of the previous embodiments, during testing, the DMU (24, 34, 44, 54) monitors the current through and/or voltage across respective sense resistor (25, 35, 45, 55) via connections to each terminal of its respective sense resistor (25, 35, 45, 55). DMU (24, 34, 44, 54) and test system (20, 30, 40, 50) are configured to store this current and/or voltage information for immediate and/or later use by test system (20, 30, 40, 50) and users of test system (20, 30, 40, 50). Furthermore, by measuring the initial slope of the recovery (a minimal number of multiple initial parameter measurements—Dynamic RDSon Recovery of the device under test from current collapse—, and fitting the data into a well characterized model that has been previously determined, the test system can predict the recovery time for the device under test rather than waiting to actually measure the entire recovery curve for the device under test (measuring until the device has fully recovered). This considerably reduces test times, which is an important goal in semiconductor device testing (decreasing test time, which allows more devices to be tested in a given time period). More specifically, the test system (20, 30, 40, 50), is configured to use Microtester, LLC's Dynamic Measurement Unit as the DMU (24, 34, 44, 54). In this case, the DMU's curve tracer capability and ability to make rapid measurements across sense resistor (25, 35, 45, 55) while the device under test is recovering are employed to measure only the initial portion of the recovery period, and then, using previously obtained information about the device under testing's fabrication process, accurately predict when the device under test will have fully recovered. For example, as shown in FIG. 6, the test system has taken 8 measurements (60, 61, 62, 63, 64, 65, 66, 67) of the DUT's RDSon at 8 discrete points in time early on in the recovery of the DUT. These 8 measurements are then compared with the device under testing's parameter curve (as shown they are fit to the device's parameter curve), and the test system projects, given those initial 8 data points and the parameter curve, how long it would have taken the device under test to fully recover. This eliminates the need to continue to test the DUT until it has completely recovered, while still providing an accurate representation of what the recovery time would be for the DUT. It should be appreciated that more or fewer than 8 measurements may be taken of the DUT, with the number of measurements being determined based on the accuracy of the projected recovery time that is needed.

Figure 7:
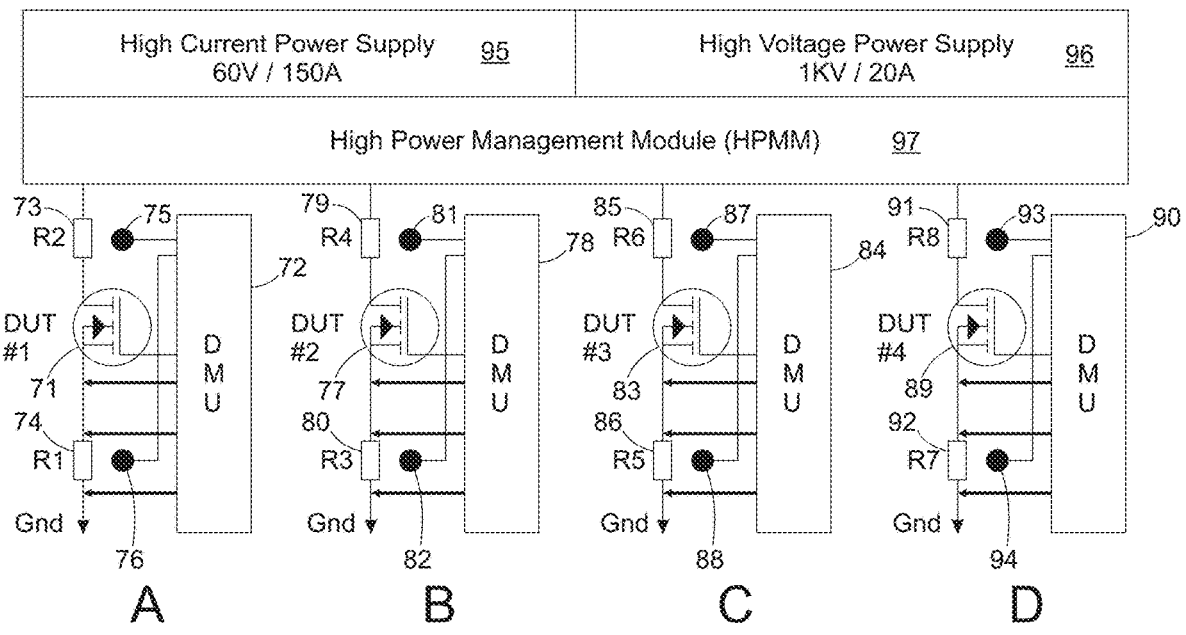
FIG. 7 is a schematic generally illustrating a system for testing multiple semiconductor transistors to measure various parameters for the transistors, according to an embodiment of the invention; and, FIG. 8 is a flow chart generally illustrating a method for measuring semiconductor transistor parameters, according to an embodiment of the invention.

FIG. 7 is a schematic generally illustrating a multiple device testing system 70 for testing multiple semiconductor devices (DUT 71, 77, 83 and 89) to measure various parameters for those semiconductor devices, according to an embodiment of the invention. As shown, the multiple device testing system 70 embodiment of FIG. 7 includes four (4) separate testing sub-sections A, B, C and D. Each of testing sub-sections A, B, C and D includes components discussed in detail in each of the previous embodiments of FIGS. 2, 3, 4, and 5. More specifically, each of testing sub-sections A, B, C and D includes, respectively: a dynamic measurement unit ("DMU") (72, 78, 84, 90), corresponding to DMUs 24, 34, 44 and 54; a load resistor (73, 79, 85, 91) corresponding to load resistors 23, 33, 43 and 53; a temperature sensor proximate to a respective load resistor (75, 81, 87, 93) corresponding to temperature sensors 26, 36, 46 and 56; a sense resistor (74, 80, 86, 92) corresponding to sense resistors 25, 35, 45 and 55; and a temperature sensor proximate to a respective sense resistor (76, 82, 88, 94) corresponding to temperature sensors 27, 37, 47 and 57. Unlike the previous embodiments of FIGS. 2, 3, 4 and 5, however, each of testing sub-sections A, B, C and D does not have its own power supply (corresponding to power supplies 22, 32, 42 and 52). Instead, in the embodiment of FIG. 7, multiple device testing system 70 includes both a high-current power supply 95 and a high voltage power supply 96, each of which is coupled to a high power management module (HPMM) 97. In an embodiment, high-current power supply 95 is configured to provide 60V at 150 A, and high voltage power supply 96 is configured to provide 1 KV at 20 A. It should be appreciated that in alternative embodiments, high-current power supply 95 may be configured to provide other currents and power levels, and high-voltage power supply 96 may be configured to provide other currents and power levels. HPMM 97 is in turn connected to each of load resistors 73, 79, 85 and 91. HPMM 97 is configured to select which of high current power supply 95 and high voltage power supply 96 is connected to the input end of each load resistor 73, 79, 85 and 91, with that selection being determined by the device that is to be tested in each of testing sub-sections A, B, C and D, and based on what parameters are being tested in each of testing sub-sections A, B, C and D. It should be understood that the devices being tested in testing sub-sections A, B, C and D (DUT 71, DUT 77, DUT 83 and DUT 89) are removably connected to testing sub-sections A, B, C and D such that they may be easily removed from testing sub-sections A, B, C and D when testing has been completed, and replaced with other devices to be tested.

In operation, multiple device testing system 70 operates in a manner similar to the embodiments of FIGS. 2-5 in that each testing sub-section A, B, C and D tests the DUT coupled to it in the same ways as the embodiments of FIGS. 2-5, but instead of only testing one device at a time, multiple device testing system 70 is able to test four devices in parallel (at the same time). It should be appreciated that multiple device testing system 70 may be operated such that different tests can be performed in parallel by testing sub-sections A, B, C and D (in other words, for example, one sub-section may be testing the DUT coupled to it for RDSon, while another sub-section may be testing the DUT coupled to it for RDSoff, etc. In addition, although multiple device testing system 70 is show configured to test four DUTs in parallel, multiple device testing system 70 may be configured to test more or fewer DUTs in parallel (e.g. more than four devices, in which case additional testing sub-sections E, F, G . . . n) may be provided in multiple device testing system 70, or as few as two testing sub sections (e.g. A and B) may be provided.

To be clear, the embodiment of FIG. 7 may be configured to implement any of the tests (and by similar means) described in the embodiments of FIGS. 2-5, but sharing the power supplies used by those testing circuits across multiple test circuits, using a power management module to control which voltages and currents are supplied to each testing circuit.

FIG. 8 is a flow chart generally illustrating a method 100 for measuring semiconductor transistor parameters, according to an embodiment of the invention. Referring to FIG. 8, method 100 includes a first step 102 of providing a test system having: a power supply with a power supply output; a test resistor having a grounded end and an ungrounded end; and, a measurement unit having first and second test inputs, a first voltage output, and a second voltage output, wherein the second test input is coupled to the grounded end of the test resistor.

Second step 104 includes coupling a device under test ("DUT") to the test system by coupling the drain of the DUT to the power supply output, coupling the source of the DUT to the ungrounded end of the test resistor and the first test input and second voltage output, and coupling the gate to the first voltage output.

Third step 106 includes the step of causing the power supply to provide a voltage or current to the DUT drain via the power supply output.

Fourth step 108 includes the step of causing the measurement unit to provide a voltage level to the gate of the DUT via the first voltage output to turn the DUT on or off.

Fifth step 110 includes the step of measuring in the measurement unit, across the first and second test inputs coupled to the test resistor, at least one of a voltage or current value for the test resistor.

Finally, sixth step 112 includes the step of determining, based on the measured value, at least one parameter of the DUT.

The system and methods described above allow users to more quickly and accurately measure RDSon, RDSoff and Current Collapse, both in engineering characterization and in high-volume production test environments.

The embodiments and examples set forth herein were presented in order to best explain the present invention and its practical application and to thereby enable those of ordinary skill in the art to make and use the invention. However, those of ordinary skill in the art will recognize that the foregoing description and examples have been presented for the purposes of illustration and example only. The description as set forth is not intended to be exhaustive or to limit the invention to the precise form disclosed. Many modifications and variations are possible in light of the teachings above without departing from the spirit and scope of the forthcoming claims.

The invention claimed is:

1. A system for measuring parameters of a semiconductor device comprising:

a) a power supply for providing at least one of voltage or current to a semiconductor device to be tested via a power supply output, wherein the semiconductor device to be tested comprises a source, a drain, and a gate;

b) a test resistor having a grounded end and an ungrounded end;

c) a measurement unit having first and second test inputs, a first voltage output, and a second voltage output, wherein the second test input is coupled to the grounded end of the test resistor, and wherein the first test input is coupled to the ungrounded end of the resistor; and, d) connection points configured to allow the semiconductor device to be tested, while being tested, to have its drain to be electrically coupled to the power supply output, its source electrically coupled to the ungrounded end of the test resistor and the first test input and second voltage output, and its gate electrically coupled to the first voltage output.

2. The system of claim 1, further comprising a semiconductor device having its drain electrically coupled to the power supply output, its source electrically coupled to the ungrounded end of the test resistor and the first test input and second voltage output, and its gate electrically coupled to the first voltage output.

3. The system of claim 2, wherein the semiconductor device is a transistor.

4. The system of claim 3, wherein the transistor is a MOSFET.

5. The system of claim 2, wherein the transistor is a gallium nitride GaN.

6. The system of claim 1, further comprising a load resistor interposed between the power supply and the drain of the semiconductor device.

7. The system of claim 1, wherein the measurement unit is configured to measure at least one value of a voltage across, or current through, the test resistor.

8. The system of claim 7, wherein the system is configured to determine, based on the at least one value, at least one parameter of the semiconductor device.

9. The system of claim 8, wherein the at least one parameter is RDSon, RDSoff, or recovery time from current collapse.

10. The system of claim 7, wherein the measurement unit comprises logic and memory, and is configured to store measured values and calculate, based on stored measured values and previously determined semiconductor device performance characteristics stored in the measurement unit, additional parameters of the semiconductor device.

11. A system for simultaneously measuring parameters of multiple semiconductor devices comprising:

a) a high-current power supply for providing power to semiconductor devices to be tested;

b) a high voltage power supply for providing power to semiconductor devices to be tested;

c) a high power management module coupled to the high current power supply and the high voltage power supply, and further configured to provide power to multiple semiconductor devices to be tested, wherein the high power management module is configured to provide predetermined power (at predetermined voltages and currents) to the multiple semiconductor devices to be tested via multiple power supply outputs;

d) a plurality of sub-test sections, each electrically coupled to its own corresponding power supply output, and each configured to electrically couple to one semiconductor device to be tested, wherein each semiconductor device to be tested comprises a source, a drain, and a gate, each sub-test section comprising: a test resistor having a grounded end and an ungrounded end; a measurement unit having first and second test inputs, a first voltage output, and a second voltage output, wherein the second test input is coupled to the grounded end of the test resistor, and wherein the first test input is coupled to the ungrounded end of the resistor; and, connection points configured to allow a semiconductor device to be tested, while being tested, to have its drain to be electrically coupled, through a load resistor, to a power supply output corresponding to the sub-test section, its source electrically coupled to the ungrounded end of the test resistor and the first test input and second voltage output, and its gate electrically coupled to the first voltage output.

12. The system of claim 11, further comprising a semiconductor device electrically coupled to each sub-test section, each semiconductor device having its drain electrically coupled, through a load resistor, to the power supply output corresponding to the sub-test section, its source electrically coupled to the ungrounded end of the test resistor and the first test input and second voltage output, and its gate electrically coupled to the first voltage output.

13. The system of claim 12, wherein the semiconductor devices are transistors.

14. The system of claim 13, wherein the transistors are MOSFETs.

15. The system of claim 14, wherein the transistors are Gallium Nitrides GaNs.

16. A method for measuring a parameter of a semiconductor device, the method comprising the steps of:

a) providing a test system having: a power supply with a power supply output; a test resistor having a grounded end and an ungrounded end; and, a measurement unit having first and second test inputs, a first voltage output, and a second voltage output, wherein the second test input is coupled to the grounded end of the test resistor;

b) coupling a device under test ("DUT") to the test system by coupling the drain of the DUT, through a load resistor, to the power supply output, coupling the source of the DUT to the ungrounded end of the test resistor and the first test input and second voltage output, and coupling the gate to the first voltage output;

c) causing the power supply to provide a voltage or current to the DUT drain via the power supply output through the load resistor;

d) causing the measurement unit to provide a voltage level to the gate of the DUT via the first voltage output to turn the DUT on or off;

e) measuring in the measurement unit, across the first and second test inputs coupled to the test resistor, at least one of a voltage or current value for the test resistor; and, f) determining, based on the measured value, at least one parameter of the DUT.

17. The method of claim 16, further comprising the steps of:

a) repeating the measurement and determination step multiple times for the same device over a period of time at discrete points in time, wherein the period of time is less than the period of time normally required for the device to recover from a stimulus event;

b) capturing the repeated measurements for later use;

c) projecting, based on analysis of the captured repeated measurements, the amount of time required for the device to recover from the stimulus.

18. The method of claim 17, wherein the stimulus event is a current collapse event, and wherein the projection predicts the time required for the device to recover from a current collapse event without the device having been tested for the full duration of recovery from the current collapse event.

\* \* \* \* \*